United States Patent [19]

Jayakumar

[11] Patent Number: 5,001,447

[45] Date of Patent: Mar. 19, 1991

[54] FERROMAGNETIC COMPENSATION RINGS FOR HIGH FIELD STRENGTH MAGNETS

[75] Inventor: Raghavan Jayakumar, Florence, S.C.

[73] Assignee: General Electric Company, Milwaukee, Wis.

[21] Appl. No.: 397,238

[22] Filed: Aug. 23, 1989

[51] Int. Cl.[5] ............................................. H01F 5/00
[52] U.S. Cl. ..................................... 335/299; 324/320
[58] Field of Search ...................... 335/299, 301, 304; 324/318, 319, 320

[56] References Cited

U.S. PATENT DOCUMENTS

| | | | |
|---|---|---|---|
| 4,635,017 | 1/1987 | Ries | 335/301 |
| 4,646,045 | 2/1987 | Chari et al. | 335/301 |
| 4,698,611 | 10/1987 | Vermilyea | 335/298 |
| 4,724,412 | 2/1988 | Kalafala | 335/299 |
| 4,758,812 | 7/1988 | Forster et al. | 335/301 |
| 4,771,243 | 9/1988 | Vreugdenhil et al. | 324/320 |

OTHER PUBLICATIONS

"Magnet Field Profiling: Analysis and Correcting Coil Design", Francoise Romeo and D. I. Hoult, Magnetic Resonance in Medicine 1,44–65 (1984), pp. 44–64.

Primary Examiner—George Harris
Attorney, Agent, or Firm—Quarles & Brady

[57] ABSTRACT

A reduced length, high field strength magnet, comprised of a number of superconducting magnet coils has ferromagnetic compensation rings positioned coaxially around the magnet bore axis to reduce axial inhomogeneities. The rings are positioned symmetrically around the bore axis centerpoint. Both the position of the magnet coils and the position of the ferromagnetic compensation rings are determined by an iterative optimization process checked by finite element modeling.

1 Claim, 3 Drawing Sheets

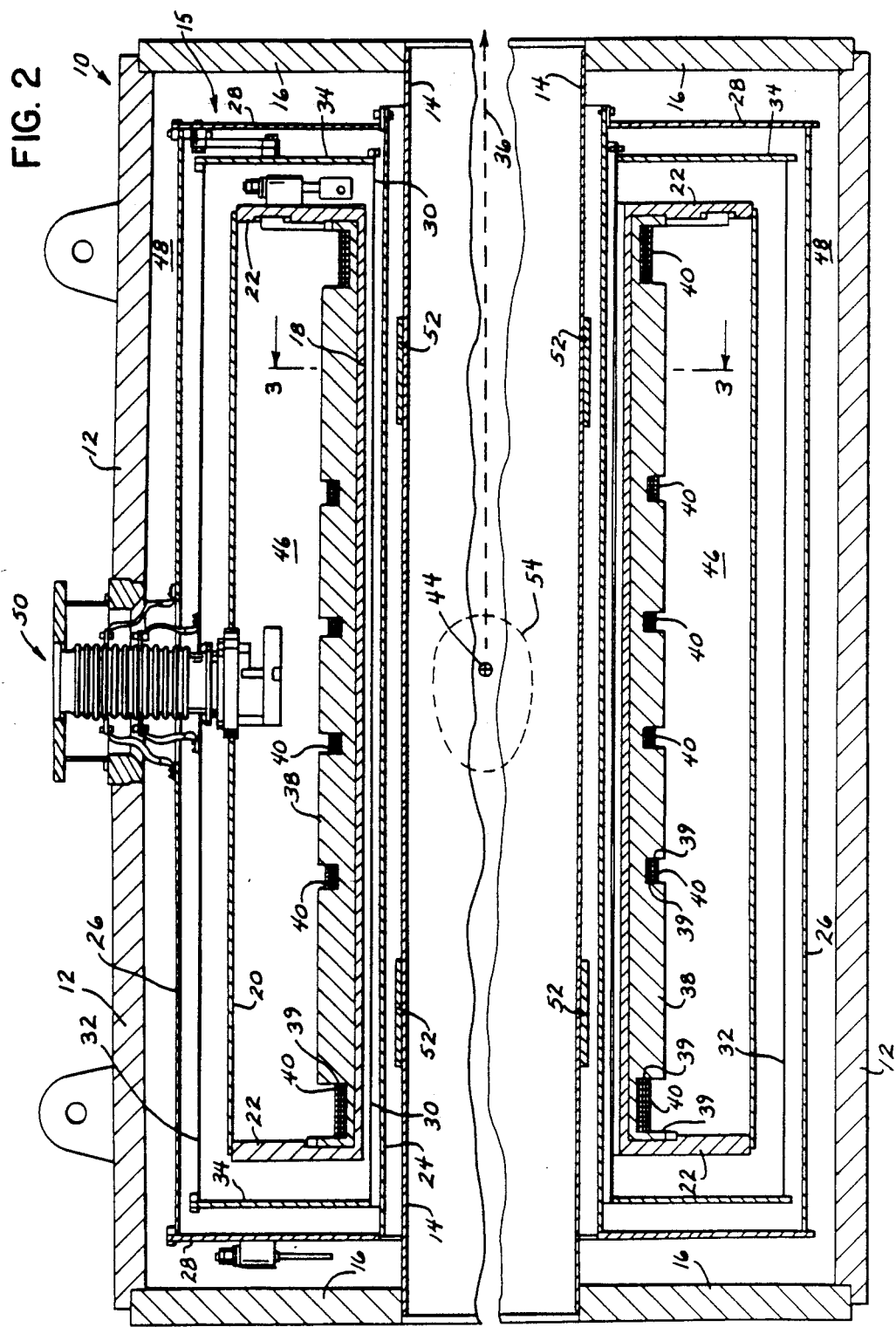

FERROMAGNETIC COMPENSATION RINGS FOR HIGH FIELD STRENGTH MAGNETS

BACKGROUND OF THE INVENTION

The present invention relates to the construction of high field D.C. magnets and, more particularly, to a means for reducing the axial length of such magnets while preserving a high degree of field homogeneity.

DISCUSSION OF THE PRIOR ART

High field strength magnets are used in a variety of applications including particle accelerators, NMR spectroscopy equipment and magnetic resonance imaging equipment. In magnetic resonance imaging equipment, high uniformity (homogeneity) of the magnetic field is required because small deviations in magnetic field strength may distort or produce artifacts in the resulting image. Typically such magnets are superconducting: constructed of solenoid coils wound of superconducting wire and immersed in a bath of liquid helium held within a cryogenic container or cryostat.

The highly uniform magnetic fields of such magnets are realized through the use of multiple pairs of solenoid coils whose number and volume may require an extended magnet bore length. As a general rule, highly uniform magnet fields require many coil pairs over long bore lengths.

Magnets with long bore lengths have certain drawbacks. The weight and cost of the magnet rises as the length increases because of the need for additional support structure. In the case of self-shielded magnets, a longer bore length increases the size and cost of the required shielding. Patient comfort, during magnetic resonance imaging in which the patient is positioned within the bore of the magnet, may be less in longer bore length magnets which create a sense of being "closed in". Finally, space restrictions at many institutions preclude the use of longer bore length magnets.

SUMMARY OF THE INVENTION

In the present invention, a reduced bore length magnet comprises one or more magnet coil pairs positioned coaxially about a bore axis and symmetrically opposed about a bore axis center point. One or more ferromagnetic compensation ring pairs are positioned coaxially about the magnet bore axis with each ring also symmetrically opposed about the bore axis center point. The dimensions of the coils: radius, axial position and ampere-turns, and the dimensions of the compensation rings: radius and axial position, are selected to reduce the magnetic field inhomogeneities. Initial values are chosen for the number of coils and ferromagnetic rings and the limits of the magnet's dimensions. A target flux density is chosen for certain points within a volume of interest within the magnet bore and the dimension of the coils and rings, within the predetermined limits, are determined by means of an iterative process based on this target flux density. The optimization process assumes the rings have a saturation flux and initially the contribution from any shield is ignored. A finite element model is then constructed to determine the field contributions, at the target flux points, resulting from the shield and the actual flux of the compensation rings. If the homogeneity of the field, as determined by the finite element model, is not at the level desired, the field contribution from the shield and rings is held constant and the iteration is repeated adjusting only the coil dimensions until the desired homogeneity is reached.

It is an object of the present invention, therefore, to produce a magnet with a shorter bore length, and yet with a field homogeneity comparable to longer bore length magnets. The ferromagnetic rings alter the local magnetic field structure to reduce inhomogeneities resulting from the shorter bore length or fewer magnet coil pairs.

It is a further object of the invention to provide a method of positioning the magnet coils and ferromagnetic rings so as to reduce magnetic field inhomogeneities for a given number of magnet coils in a magnet of a given length.

Other objects and advantages besides those discussed above shall be apparent to those experienced in the art from the description of a preferred embodiment of the invention which follows. In the description, reference is made to the accompanying drawings, which form a part hereof, and which illustrate one example of the invention. Such example, however, is not exhaustive of the various alternative forms of the invention, and therefore reference is made to the claims which follow the description for determining the scope of the invention.

BRIEF DESCRIPTION OF THE DRAWINGS

FIG. 2 is a cross-sectional view of the magnet of FIG. 1 taken along lines 2—2 of FIG. 1;

DETAILED DESCRIPTION OF THE PREFERRED EMBODIMENT

Figure 1:
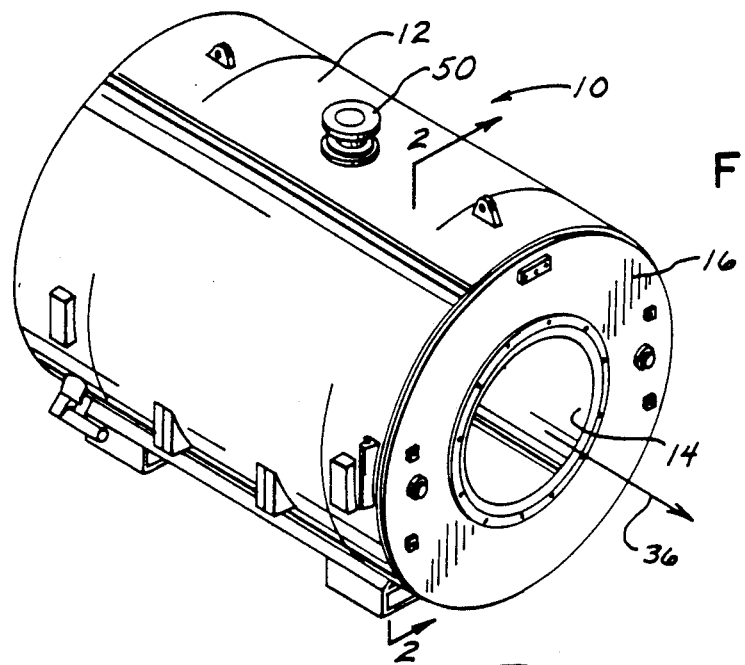
FIG. 1 is an isometric view of a magnetic resonance imaging magnet in accordance with the present invention.
Figure 3:
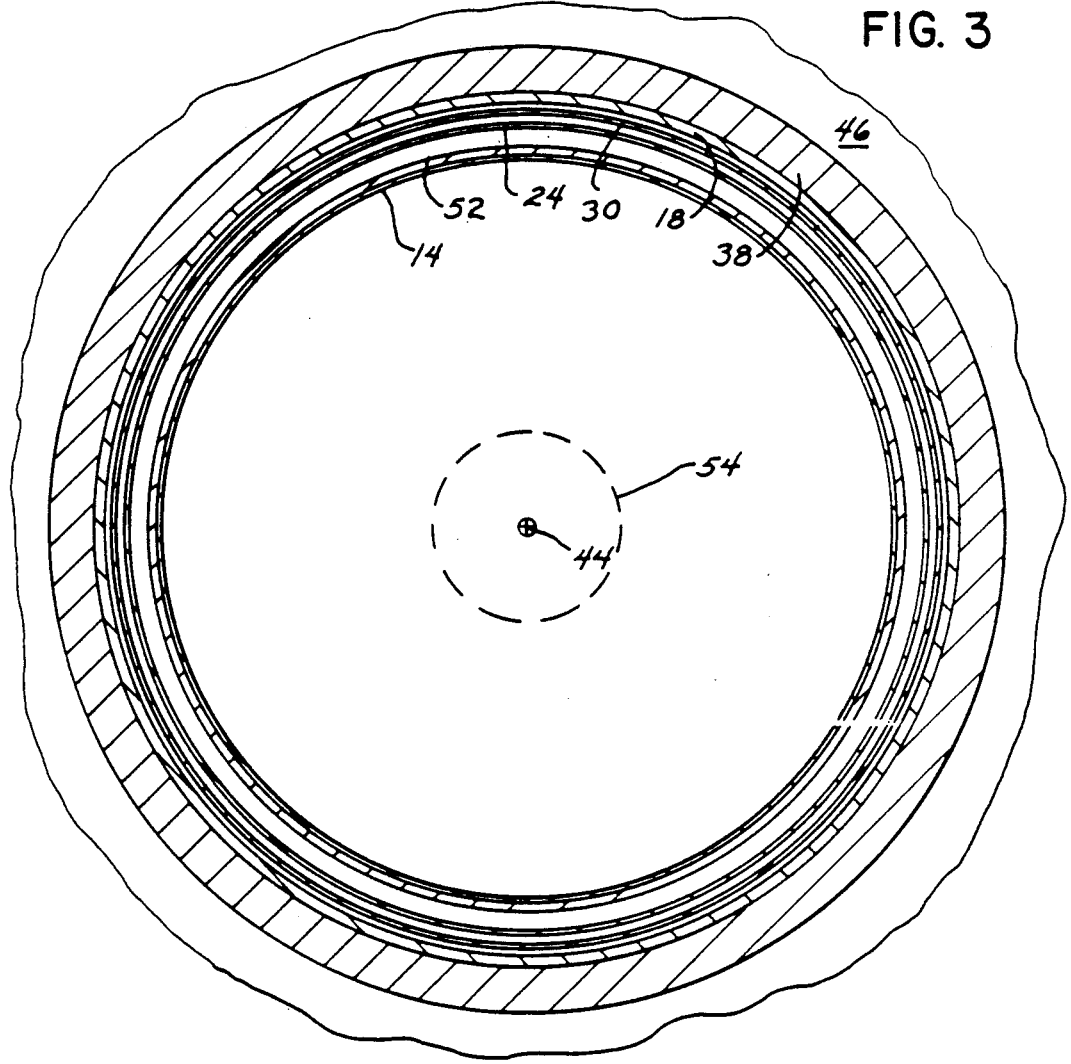
FIG. 3 is cross sectional view of the magnet of FIG. 1 along the lines 3—3 of FIG. 2.

Referring FIG. 1 an MR magnet assembly 10 is contained in a vacuum vessel cylinder 12, and end plates 16 and bore cylinder 14 centered around a bore axis 36. The vacuum cylinder 12 and the end plates 16 may be formed of a ferromagnetic material such as mild rolled steel plate for shielded magnets or non-magnetic material for unshielded magnets while the bore cylinder 14 is formed of a non-magnetic stainless steel. These elements are welded together to form a vacuum tight annular chamber 15. For shielded magnets, the end plates 16 fit tightly against the vacuum vessel cylinder 12 to conduct magnetic flux therebetween and to reduce the magnetic field outside of the magnet bore cylinder 14 as is generally known in the art. The bore cylinder 14 enables the magnetic field to penetrate the magnet bore where a patient is situated during NMR scanning. It is the main objective of the magnet assembly 10 to provide a high-strength and homogeneous magnetic field within this bore of the magnet.

Referring to FIG. 2, the vacuum tight annular chamber 15 encloses a first heat shield comprised of cylindrical, concentric outer and inner walls 26 and 24, respectively, disposed about the bore axis 36. The spaces between the ends of the outer wall 26 and inner wall 24 are closed by end plates 28.

A second heat shield, comprised of cylindrical, concentric outer and inner wall 32 and 30, disposed about the bore axis 36, is enclosed within the first heat shield.

The spaces between the ends of the outer wall 32 and inner wall 30 are closed by end plates 34.

Within the space enclosed by the outer and inner wall 32 and 30 of the second heat shield is a liquid helium vessel comprised also of cylindrical concentric outer and inner walls 20 and 18 which are also co-axial with the bore axis 36. The spaces between the ends of the outer wall 20 and inner wall 18 are closed by end plates 22.

The first and second heat shield and helium vessel are constructed out of a non-magnetic material such as aluminum.

Within the space contained by the helium vessel is a cylindrical coil form 38, which is also co-axial with the bore axis 36. It holds a series of magnet coils 40 spaced apart along the bore axis 36. The coils 40 are positioned coaxially with the bore axis 36 and are symmetrically paired about a center point 44 along the bore axis 36. The construction of one such a coil form, suitable for use in the present invention is described in in co-pending application serial number 07/278,124 which was filed on Nov. 30, 1988 and entitled:"Support Structure for High Field Magnet Coils" and is assigned to the same assignee as the present invention and is hereby incorporated by reference.

During operation of the magnet 10, the liquid helium vessel is filled with liquid helium 46 so as to cool the magnet coils 40 into a superconducting state. The magnetic fields generated by the coils 40 cause the coils 40 to repel or attract each other and, therefore, the coils 40 must be restrained against axial movement by a series of retention surfaces 39 which ring the circumference of the coil form 38. These retention surfaces 39 also serve to accurately position the magnet coils 40 with respect to each other.

The construction of a superconducting magnet suitable for use with the present invention is further described in detail in the following U.S. patents assigned to the same assignee as the present invention and hereby incorporated by reference: 4,771,256, "Integral Shield for MR Magnet"; 4,724,412, "Method of Determining Coil Arrangement of an Actively Shielded Magnetic Resonance Magnet"; 4,800,354, "Superconducting Magnetic Resonance Magnet and Method of Making Same"; 4,721,934, "Axial Strap Suspension System for a Magnetic Resonance Magnet.

A pair of ferromagnetic compensation rings 52 are welded to the outer surface of the bore cylinder 14 coaxially with the bore axis 36, and symmetrically disposed about the bore axis center point 44. The compensation rings 52 may be fabricated of low carbon steel or ingot iron or other material with a high saturation flux density.

For the 0.5 Tesla magnet of the present invention having three coils pairs A, B, and C, of ampere turns 216834.8, 90650.0, and 51489.2 respectively, the following dimensions have been used successfully to reduce the inhomogeneities within a spherical volume of 40 cm dia centered at the bore centerpoint 44 to less than 18 ppm.:

| Dimensions | Inches |
| --- | --- |
| Average radius of coil A | 20.182 |
| Axial distance from center of A to bore centerpoint | 22.710 |
| Average radius of coil B | 20.328 |
| Axial distance from center of B to bore centerpoint | 8.946 |
| Average radius of coil C | 20.289 |
| Axial distance from center of C to bore centerpoint | 2.744 |
| Inside radius of compensation ring | 16.920 |
| Radial thickness of compensation coil | 0.127 |
| Axial length of compensation coil | 2.0475 |

The magnet assembly 10 has a vacuum vessel cylinder 12 of iron which serves as a magnetic shield; the cylinder 12 has an outer radius of 32.967" and thickness of 1.865". The end plates 16 have a bore radius of 16.732" and thickness of 1.865".

The exact dimensions and composition of the compensation rings will vary depending on the particular configuration of the magnet including the ampere turns of the magnet coils, their radius and axial spacing.

The desired length of the magnet and the number of coil pairs and the number of compensation rings are predetermined based on the magnet's application and the physical and cost constraints on the system. Generally there is a tradeoff between magnet length and number of coils, homogeneity and cost. As mentioned, the availability of space at the institution using the magnet may limit magnet length.

Determining the position the coils and ferromagnetic compensation rings in the magnet is complicated by the nonlinear influence of the ferromagnetic compensation rings and magnetic shield on the magnetic field. This prevents the simple superposition of the effects of each coil and ring in determining the magnetic field within the magnet bore. Instead, a two-part iterative procedure is used as shown in FIG. 4.

Figure 4:
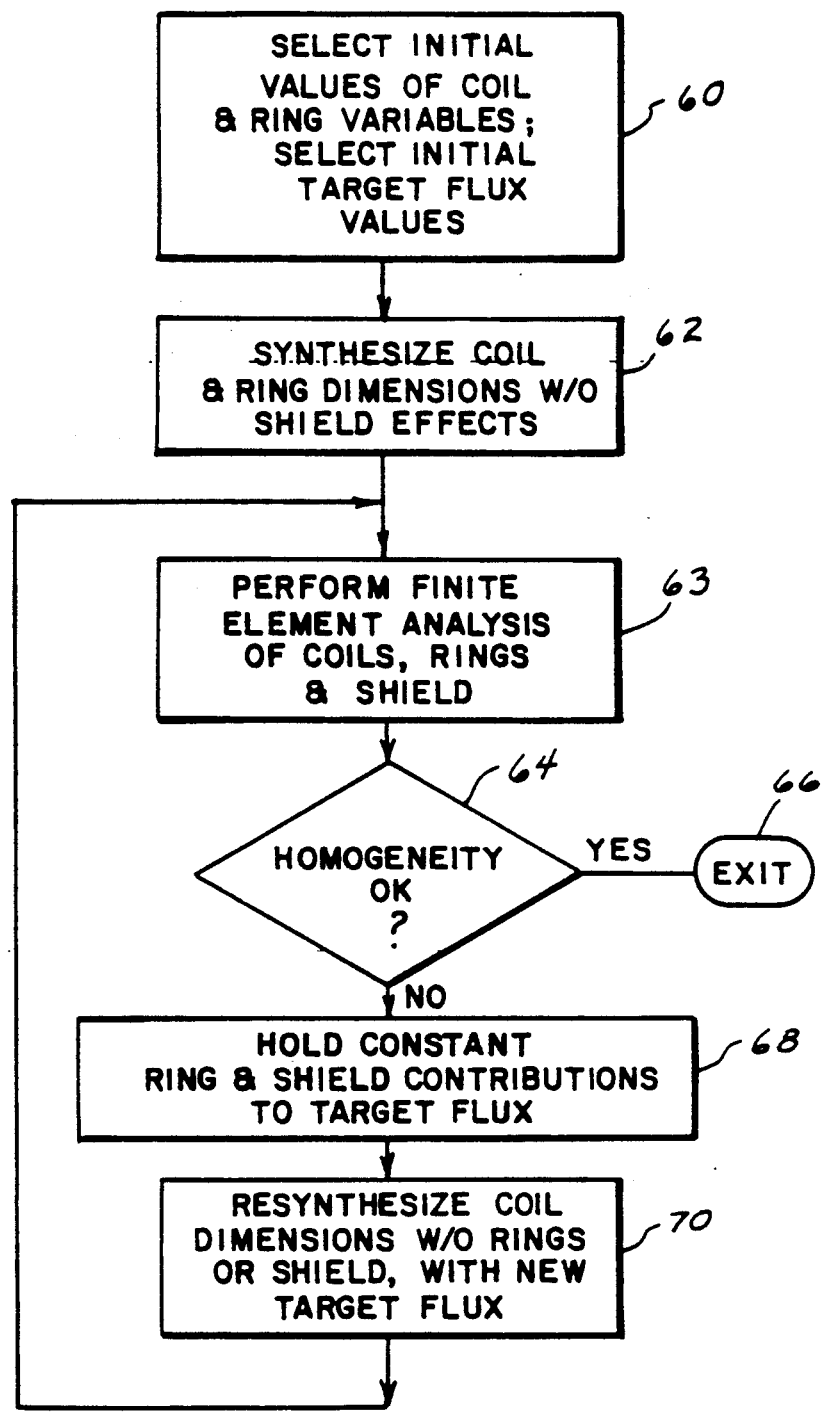
FIG. 4 is a flow chart of the process for locating the coil pairs and compensation rings within the magnet of FIG. 1.

Referring to FIG. 4, and process block 60, the number of coils 40 and compensation rings 52 is selected as are the bounds for the coil and ring variables, specifically, the axial and radial dimensions and ampere-turns of the coils and the axial and radial dimensions of the rings. The bounds are limits outside of which the variables may not move. For example, the maximum magnet length is specified which limits the maximum axial position of the coils and rings. Similar bounds are imposed for minimum and maximum coil and ring radius and for maximum and minimum coil ampere-turns. These bounds are predetermined based on the tradeoffs discussed above. The dimensions of the magnetic shield, if any, are also chosen.

Also at process block 60, a target flux density is established representing values of flux density at a series of field points within the volume of interest 54. The initial target flux values are selected to provide the desired level of magnetic field homogeneity. The number of field points in the target flux will be equal to the number of degrees of freedom in the coil structure to be discussed below.

At process block 62 the dimensions of the coils and rings are determined using an iterative Newton-Raphson procedure to produce the target flux specified at the particular field points. This procedure is performed on a high speed computer such as the VAX manufactured by the Digital Equipment Corporation. The variables that may be changed and hence the degrees of freedom of the iteration are: the axial and radial position and ampere-turns of the coils, for each coil, and the axial and radial position of the rings for each ring. The flux density of the rings is assumed to be at their saturation level and the contribution of each ring and coil to the field at the field points is computed using the Biot-Savart law.

The variables selected in process block 62 are entered into a finite element magnetic modeling program which may also be run on a VAX or similar computer. The finite element program calculates the actual effect of the magnetic shield and the rings on the magnetic field at the field points in the volume of interest, as indicated by process block 63.

The homogeneity of the axial magnetic field within the volume of interest is checked at decision block 64 and if the desired homogeneity has been reached, the program is exited at process block 66 and the coil is fabricated with the variables determined in process block 62.

If the desired homogeneity has not been reached, the contribution of the magnetic shield and compensation rings to the magnetic field at the field points is held constant in the Newton-Raphson iteration, per process block 68 and the coil positions are recalculated by the iterative NewtonRaphson procedure per process block 70, but with the ring variables fixed and only the coil variables changed. The loop formed by the process and decision blocks 63-70 is repeated until the desire homogeneity has been obtained.

Finite element programs suitable for calculating the homogeneity of magnetic fields generated by current carrying coils in the presence of a ferromagnetic shield and ferromagnetic rings, are commercially available from a number of suppliers of computer aided engineering products, including: The MacNeal-Schwendler Corporation of Milwaukee Wis., and the Magnus Software Corporation of Woodlands Tex., who both produce a finite element magnetic modeling program suitable for this iterative process.

It will be apparent to one skilled in the art that the symmetry of a cylindrical magnet and the symmetry of the coil and ring placement about the bore centerpoint 44 will yield a savings in calculations. Only a two dimensional plane incorporating the bore axis need be considered, and only one fourth of that plane, as defined by the bore axis and a lateral axis intersecting the bore axis centerpoint 44 at right angles to the bore axis 36.

The above description has been that of a preferred embodiment of the present invention. It will occur to those who practice the art that many modifications may be made without departing from the spirit and scope of the invention. For example, Monte Carlo, steepest descent, or linear programming techniques may be used to determine the optimal coil and ring positions, with the appropriate constraints in magnet dimensions and ampere turns. Additional rings may be used with appropriate adjustments in ring and coil positions and dimensions. In order to apprise the public of the various embodiments that may fall within the scope of the invention, the following claims are made.

I claim:

1. A method of reducing the bore length in a cylindrical magnet assembly including, one at least magnet coil pair means positioned coaxially to a bore axis for generating a magnetic field along said bore axis, a magnetic shield, and one at least ferromagnetic compensation ring positioned coaxially about the magnet bore axis for reducing magnetic field inhomogeneities, comprising the steps of:

(a) selecting the number of coils and rings and bounds on the coil axial and radial dimensions and bounds on the ring axial and radial dimensions;

(b) setting a target flux having the desired homogeneity level for a number of field points within a volume of interest within the magnet bore;

(c) calculating the coil axial and radial positions and ampere turns and the ring axial and radial positions based on the target flux;

(d) determining the homogeneity within the volume of interest by calculating the field contributions from the shield and rings (e) holding the field contribution from the shield and rings constant;

(f) recalculating the coil axial and radial positions based on the new target flux;

(g) repeating steps d-f until the desired homogeneity has been reached.

* * * * *

UNITED STATES PATENT AND TRADEMARK OFFICE
CERTIFICATE OF CORRECTION

PATENT NO. : 5,001,447
DATED      : March 19, 1991
INVENTOR(S): Raghavan Jayakumar It is certified that error appears in the above-identified patent and that said Letters Patent is hereby corrected as shown below:

Col. 6, line 18   "one at least" should be --at least one--.

Signed and Sealed this

Fifteenth Day of September, 1992

Attest:

DOUGLAS B. COMER

Attesting Officer    Acting Commissioner of Patents and Trademarks